(12) United States Patent
Noh et al.

(10) Patent No.: US 9,306,156 B2
(45) Date of Patent: Apr. 5, 2016

(54) METHODS OF MANUFACTURING A MAGNETORESISTIVE RANDOM ACCESS MEMORY DEVICE

(71) Applicants: Eun-Sun Noh, Suwon-si (KR); Jong-Chul Park, Seongnam-si (KR); Shin Kwon, Yongin-si (KR); Hyung-Joon Kwon, Seongnam-si (KR); Chae-Lyoung Kim, Seoul (KR); Hye-Ji Yoon, Pyeongtaek-si (KR)

(72) Inventors: Eun-Sun Noh, Suwon-si (KR); Jong-Chul Park, Seongnam-si (KR); Shin Kwon, Yongin-si (KR); Hyung-Joon Kwon, Seongnam-si (KR); Chae-Lyoung Kim, Seoul (KR); Hye-Ji Yoon, Pyeongtaek-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 6 days.

(21) Appl. No.: 14/533,084

(22) Filed: Nov. 4, 2014

(65) Prior Publication Data
US 2015/0236251 A1 Aug. 20, 2015

(30) Foreign Application Priority Data
Feb. 18, 2014 (KR) .................. 10-2014-0018328

(51) Int. Cl.
*H01L 43/12* (2006.01)
*H01L 27/22* (2006.01)
*H01L 43/02* (2006.01)
*H01L 43/08* (2006.01)

(52) U.S. Cl.
CPC .............. *H01L 43/12* (2013.01); *H01L 27/222* (2013.01); *H01L 27/228* (2013.01); *H01L 43/08* (2013.01)

(58) Field of Classification Search
CPC ....... H01L 27/228; H01L 43/12; H01L 43/08; H01L 27/222; H01L 43/02; H01L 21/76289; B82Y 25/00
See application file for complete search history.

(56) References Cited

U.S. PATENT DOCUMENTS

| | | | |
|---|---|---|---|
| 6,307,265 B1 * | 10/2001 | Anand et al. | 257/758 |
| 6,709,874 B2 | 3/2004 | Ning | |
| 6,780,652 B2 | 8/2004 | Lee | |
| 6,984,530 B2 | 1/2006 | Lee et al. | |
| 6,984,577 B1 * | 1/2006 | Zhao et al. | 438/619 |
| 7,042,758 B2 | 5/2006 | Haneda et al. | |
| 8,283,186 B2 | 10/2012 | Kim | |
| 8,940,632 B2 * | 1/2015 | Nam | 438/619 |

(Continued)

FOREIGN PATENT DOCUMENTS

| | | |
|---|---|---|
| JP | 2012204431 A | 10/2012 |
| JP | 2013201343 A | 10/2013 |

*Primary Examiner* — Latanya N Crawford
(74) *Attorney, Agent, or Firm* — Renaissance IP Law Group LLP

(57) ABSTRACT

In a method of manufacturing an MRAM device, a first sacrificial layer, an etch stop layer, and a second sacrificial layer are sequentially formed on a substrate and then partially etched to form openings therethrough. Lower electrodes are formed to fill the openings. The first and second sacrificial layers and portions of the etch stop layer are removed to form etch stop layer patterns surrounding upper portions of sidewalls of the lower electrodes, respectively. An upper insulating layer pattern is formed between the etch stop layer patterns to partially define an air pad between the lower electrodes. A first magnetic layer, a tunnel barrier layer, a second magnetic layer, and an upper electrode layer are formed, and are etched to form a plurality of magnetic tunnel junction (MTJ) structures. Each MTJ structure includes a sequentially stacked first magnetic layer pattern, tunnel layer pattern, and second magnetic layer pattern, and each of the MTJ structures contacts a corresponding one of the lower electrodes.

19 Claims, 13 Drawing Sheets

(56) References Cited

U.S. PATENT DOCUMENTS

| | | | |
|---|---|---|---|
| 2010/0181633 A1* | 7/2010 | Nam et al. | 257/421 |
| 2011/0017971 A1* | 1/2011 | Kim et al. | 257/5 |
| 2011/0183516 A1* | 7/2011 | Lee | 438/653 |
| 2012/0058639 A1* | 3/2012 | Sim et al. | 438/666 |
| 2012/0319279 A1* | 12/2012 | Isobayashi | 257/751 |
| 2013/0115748 A1* | 5/2013 | Kim | 438/381 |
| 2013/0228934 A1* | 9/2013 | Kim et al. | 257/774 |
| 2014/0342551 A1* | 11/2014 | Nam | 438/653 |

* cited by examiner

METHODS OF MANUFACTURING A MAGNETORESISTIVE RANDOM ACCESS MEMORY DEVICE

CROSS-REFERENCE TO RELATED APPLICATION

This application claims priority under 35 USC §119 to Korean Patent Application No. 10-2014-0018328, filed on Feb. 18, 2014 in the Korean Intellectual Property Office (KIPO), the contents of which are herein incorporated by reference in their entirety.

BACKGROUND

1. Field

Example embodiments of the present inventive concepts relate to methods of manufacturing a magnetoresistive random access memory (MRAM) device. More particularly, example embodiments relate to methods of forming a magnetic tunnel junction (MTJ) structure in an MRAM device.

2. Description of the Related Art

An MRAM device may execute a writing and/or reading operation at a high speed and may have non-volatile characteristics. The MRAM device may have an MTJ structure including a magnetic material such as a metal having a magnetic characteristic. When the MRAM device is manufactured, the MTJ structure needs to be formed with no failures, resulting, for example, from electrical shorts.

SUMMARY

Example embodiments provide a method of forming an MTJ structure in an MRAM device in which process failures may be reduced.

According to example embodiments, a method of manufacturing an MRAM device is provided. In the method, a first sacrificial layer, an etch stop layer, and a second sacrificial layer are sequentially formed on a substrate. The second sacrificial layer, the etch stop layer, and the first sacrificial layer are partially etched to form openings therethrough. Lower electrodes are formed to fill each of the respective openings. The first and second sacrificial layers, and portions of the etch stop layer, are removed to form etch stop layer patterns surrounding an upper portion of a sidewall of each of the lower electrodes, respectively. An upper insulating layer pattern is formed between the etch stop layer patterns to define an air pad between the lower electrodes. A first magnetic layer, a tunnel barrier layer, a second magnetic layer, and an upper electrode layer are formed on the lower electrodes, the etch stop layer patterns, and the upper insulating layer pattern. Portions of the upper electrode layer, the second magnetic layer, the tunnel barrier layer, the first magnetic layer, the upper insulating layer pattern, and the etch stop layer patterns are etched to form a plurality of magnetic tunnel junction (MTJ) structures. Each of the MTJ structures includes a sequentially stacked first magnetic layer pattern, tunnel layer pattern, and second magnetic layer pattern. The MTJ structures each further contact a respective one of the lower electrodes.

In example embodiments, the first and second sacrificial layer may be formed to include silicon oxide, and the etch stop layer may be formed to include silicon nitride.

In example embodiments, when the lower electrodes are formed to fill the openings, a lower electrode layer may be formed on the second sacrificial layer to fill the openings. The lower electrode layer may be polished until an upper surface of the second sacrificial layer is exposed to form the lower electrodes in the openings.

In example embodiments, when the first and second sacrificial layers, and the portions of the etch stop layer, are removed to form the etch stop layer patterns, the second sacrificial layer may be removed to expose the etch stop layer. The portions of the etch stop layer may be etched to form the etch stop layer patterns, thereby exposing portions of the first sacrificial layer therebetween. The exposed portions of the first sacrificial layer may be removed.

In example embodiments, when the etch stop layer patterns are formed, capping spacers may be formed of an insulating material on sidewalls of the lower electrodes protruding from the etch stop layer, and portions of the etch stop layer between the capping spacers may be etched.

In example embodiments, the capping spacers and the etch stop layer may be formed to include substantially the same material or different materials.

In example embodiments, when the capping spacers are formed, a spacer layer may be formed on the sidewalls of the lower electrodes and the etch stop layer using a chemical vapor deposition (CVD) process, and the spacer layer may be anisotropically etched.

In example embodiments, when the second sacrificial layer is removed, the capping spacers may also be removed.

In example embodiments, when the upper insulating layer pattern between the etch stop layer patterns is formed, an upper insulating layer may be formed to cover the lower electrodes and a space between the etch stop layer patterns, and the upper insulating layer may be polished to expose upper surfaces of the lower electrodes.

In example embodiments, the upper insulating layer may be formed to include a material having a polishing selectivity with respect to the etch stop layer.

In example embodiments, protection layer patterns may be formed on sidewalls of the openings.

According to example embodiments, a method of manufacturing an MRAM device can be provided. In the method, a mold structure may be formed on a substrate. The mold structure can include a first sacrificial layer, an etch stop layer, and a second sacrificial layer sequentially stacked on the substrate, and may have openings arranged through the first sacrificial layer, the etch stop layer, and the second sacrificial layer. Lower electrodes may be formed to fill the openings. The first and second sacrificial layers may be removed, and etch stop layer patterns may be formed on upper portions of sidewalls of the lower electrodes. An upper insulating layer may be formed to fill a space between the etch stop layer patterns, and the upper insulating layer may thereby define an air pad between the lower electrodes. The upper insulating layer and the lower electrodes may be polished until the etch stop layer patterns are exposed to form an upper insulating layer pattern between the etch stop layer patterns. A first magnetic layer, a tunnel barrier layer, a second magnetic layer, and an upper electrode layer may be formed on the lower electrodes, the etch stop layer patterns, and the upper insulating layer pattern. Portions of the upper electrode layer, the second magnetic layer, the tunnel barrier layer, the first magnetic layer, the upper insulating layer pattern, and the etch stop layer patterns may be etched to form a plurality of magnetic tunnel junction (MTJ) structures. Each of the MTJ structures may include a sequentially stacked first magnetic layer pattern, tunnel layer pattern, and second magnetic layer pattern. The MTJ structures may each contact a respective one of the lower electrodes.

In example embodiments, when the etch stop layer patterns are formed, the first sacrificial layer may be removed to expose the etch stop layer, and the second sacrificial layer and portions of the etch stop layer may be removed to form the etch stop layer patterns surrounding sidewalls of the lower electrodes.

In example embodiments, when the portions of the etch stop layer are removed, capping spacers may be formed on sidewalls of the lower electrodes protruding from the etch stop layer, and portions of the etch stop layer between the capping spacers may be etched.

In example embodiments, when the etch stop layer is formed to include silicon nitride, and the upper insulating layer may be formed to include silicon oxide.

According to example embodiments, an MTJ structure may be formed with reduced process failures. Additionally, an MRAM device having good electrical characteristics may be manufactured using the MTJ structure constructed according to principles of the present inventive concepts.

BRIEF DESCRIPTION OF THE DRAWINGS

Example embodiments of the present inventive concepts will be more clearly understood from the following detailed description taken in conjunction with the accompanying drawings.

FIG. 1 is a cross-sectional view of an MTJ structure constructed in accordance with example embodiments of the inventive concepts;

FIGS. 2 to 13 are cross-sectional views illustrating various stages of a method of forming the MTJ structure of FIG. 1;

FIGS. 14 to 17 are plan views illustrating various stages of a method of forming the MTJ structure of FIG. 1;

FIGS. 18 to 21 are cross-sectional views illustrating various stages of an alternative method of forming the MTJ structure of FIG. 1;

FIG. 22 is a cross-sectional view of an STT-MRAM device constructed in accordance with example embodiments;

FIGS. 23 to 25 are cross-sectional views illustrating various stages of a method of manufacturing the STT-MRAM device of FIG. 22; and FIG. 26 is a block diagram illustrating a memory system constructed in accordance with example embodiments.

DESCRIPTION OF EMBODIMENTS

Figure 1:
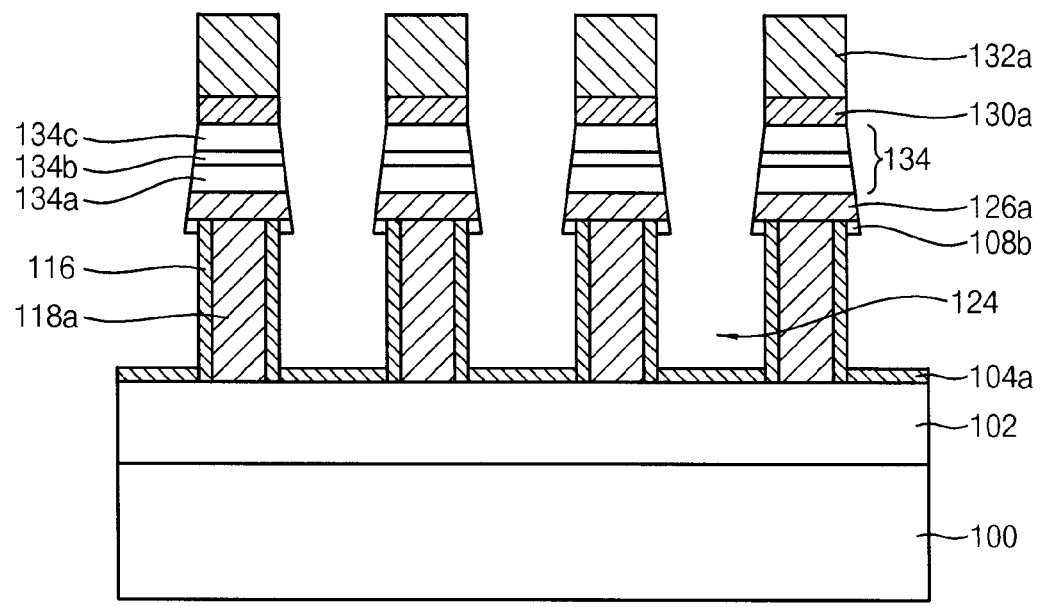
FIGS. 1 to 26 represent non-limiting, example embodiments as described herein.

Various example embodiments will be described more fully hereinafter with reference to the accompanying drawings. The present inventive concepts may, however, be embodied in many different forms and should not be construed as limited to the specific example embodiments set forth herein. Rather, these example embodiments are provided so that this description will be thorough and complete, and will fully convey the scope of the present inventive concepts to those skilled in the art. In the drawings, the sizes and relative sizes of layers and regions may be exaggerated for clarity.

It will be understood that when an element or layer is referred to as being "on," "connected to," or "coupled to" another element or layer, it can be directly on, connected, or coupled to the other element or layer, or intervening elements or layers may be present. In contrast, when an element is referred to as being "directly on," "directly connected to," or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, fourth, etc., may be used herein to describe various elements, components, regions, layers, and/or sections, these elements, components, regions, layers, and/or sections should not be limited by these terms. These terms are only used to distinguish one element, component, region, layer, or section from another region, layer, or section. Thus, a first element, component, region, layer, or section discussed below could be termed a second element, component, region, layer, or section, without departing from the teachings of the present inventive concepts.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein should be interpreted accordingly.

The terminology used herein is for the purpose of describing particular example embodiments only and is not intended to be limiting of the present inventive concepts. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from an implanted to a non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device, and are not intended to limit the scope of the present inventive concepts.

Unless otherwise defined herein, all terms (including technical and scientific terms) used herein have the same meaning as commonly understood by one of ordinary skill in the art to which the inventive concepts belong. It will be further understood that terms, such as those defined in commonly used dictionaries, should be interpreted as having a meaning that is consistent with their meaning in the context of the relevant art and should not be interpreted in an idealized or overly formal sense unless expressly defined herein.

FIG. 1 is a cross-sectional view of an MTJ structure constructed in accordance with example embodiments.

Referring to FIG. 1, a lower structure 102 may be formed on a substrate 100. A top surface of the lower structure 102 may be substantially flat. The lower structure 102 may include a contact region for an electrical connection, a transistor, an electrical wiring, an insulating interlayer, etc.

A first lower electrode 118a having a pillar shape may be formed on the lower structure 102. The first lower electrode 118a may contact at least a portion of a top surface of the contact region of the lower structure 102. In example embodiments, a plurality of first lower electrodes 118a may be regularly arranged on the lower structure 102 to define a first lower electrode array. The first lower electrodes 118a may be spaced apart from each other by a predetermined distance. Due to the space between each of the first lower electrodes 118a, an area on which a magnetic material may be re-deposited in a process for forming the MTJ structure may be increased. Thus, although magnetic material may be re-deposited, the first lower electrodes 118a may not be electrically shorted with each other. A height of the first lower electrode 118a may be about 300 Å to about 1000 Å. The first lower electrode 118a may include a metal (e.g., tungsten, titanium, tantalum, etc.) and/or a metal nitride (e.g., tungsten nitride, titanium nitride, tantalum nitride, etc.).

A protection layer pattern 116 may be formed on a sidewall of the first lower electrode 118a. A first etch stop layer pattern 104a may be formed on the lower structure 102 between the first lower electrodes 118a. The protection layer pattern 116 and the first etch stop layer pattern 104a may include an insulating material such as silicon nitride, for example. When the protection layer pattern 116 and the first etch stop layer pattern 104a include substantially the same material, the protection layer pattern 116 and the first etch stop layer pattern 104a may be merged into a single layer pattern.

A second lower electrode 126a, an MTJ pattern 134, a capping layer pattern 130a, and an upper electrode 132a may be sequentially stacked on the first lower electrode 118a. The first and second lower electrodes 118a and 126a, the MTJ pattern 134, the capping layer pattern 130a, and the upper electrode 132a may define an MTJ structure having a pillar shape, and, in example embodiments, a plurality of MTJ structures may be formed.

The second lower electrode 126a may include a metal (e.g., tungsten, titanium, tantalum, etc.) and/or a metal nitride (e.g., tungsten nitride, titanium nitride, tantalum nitride, etc.). Alternatively, the second lower electrode 126a may not be formed.

The MTJ pattern 134 may include a first magnetic layer pattern 134a, a tunnel barrier layer pattern 134b, and a second magnetic layer pattern 134c. For example, the first magnetic layer pattern 134a may serve as a pinning layer pattern having a fixed magnetization direction, and the second magnetic layer pattern 134c may serve as a free layer pattern having a changeable magnetization direction. The first and second magnetic layer patterns 134a and 134c may include a magnetic material containing, e.g., a transition metal. The magnetization directions of the first and second magnetic layer patterns 134a and 134c may be a vertical or a horizontal direction.

The capping layer pattern 130a may protect the MTJ pattern 134. The capping layer pattern 130a may, for example, include titanium, titanium nitride, tantalum, tantalum nitride, etc. These materials may be used alone or in any combination thereof.

The upper electrode 132a may include a metal (e.g., tungsten) or a metal nitride (e.g., tungsten nitride, etc.).

A bottom surface of the second lower electrode 126a may be wider than a top surface of the first lower electrode 118a, so that the second lower electrode 126a may cover the top surface of the first lower electrode 118a.

A second etch stop layer pattern 108b may be formed on an edge portion of the bottom surface of the second lower electrode 126a so as to contact an upper portion of the sidewall of the protection layer pattern 116. The second etch stop layer pattern 108b may, for instance, include silicon nitride. The second etch stop layer pattern 108b may have a ring shape surrounding an upper portion of the sidewall of the first lower electrode 118a. The second etch stop layer pattern 108b may be a residue of a second etch stop layer 108 (see FIG. 2) for forming an air pad 124 (see FIG. 9).

FIGS. 2 to 13 are cross-sectional views illustrating various stages of a method of forming the MTJ structure of FIG. 1. And FIGS. 14 to 17 are plan views illustrating various stages of the method of forming the MTJ structure of FIG. 1. More specifically, FIGS. 7 to 10 are cross-sectional views cut along a line I-I' in FIGS. 14 to 17, respectively. In FIGS. 14 to 17, illustration of a protection layer pattern is omitted for the convenience of explanation.

Figure 2:
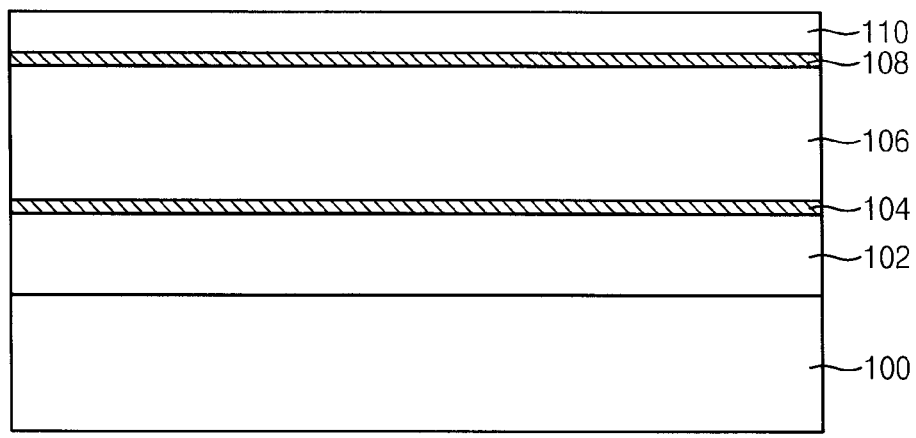

Referring to FIG. 2, a lower structure 102 may be formed on a substrate 100. The lower structure 102 may be formed to have a flat top surface. The lower structure 102 may include a contact region, a transistor, an electrical wiring, an insulating interlayer, etc. In example embodiments, a plurality of contact regions may be formed in the lower structure 102.

A first etch stop layer 104, a first sacrificial layer 106, a second etch stop layer 108, and a second sacrificial layer 110 may be sequentially formed on the lower structure 102.

The first etch stop layer 104 may be used in an etching process for forming a hole 114 (see FIG. 3) through the first sacrificial layer 106, the second etch stop layer 108, and the second sacrificial layer 110. Due to the first etch stop layer 104, damage to the lower structure 102 may be decreased during the etching process.

The first sacrificial layer 106 may be used in subsequently forming a first lower electrode 118a (see FIG. 10). Thus, the first sacrificial layer 106 may be formed to have a height substantially the same as that of the first lower electrode 118a. Also, a location occupied by the first sacrificial layer 106 may correspond to a location of a later-formed air pad 124 (see FIG. 9) arranged between a plurality of first lower electrodes 118a. Accordingly, the first sacrificial layer 106 may be formed to have a thickness substantially the same as a thickness of the air pad 124. If a thickness of the first sacrificial layer 106 is less than about 300 Å, process failures may occur because the air pad 124 may have too small a volume. If the thickness of the first sacrificial layer 106 is greater than about 1000 Å, a processing time for patterning the first sacrificial layer 106 may be unnecessarily increased. Thus, in a preferred range, the first sacrificial layer 106 may be formed to have a thickness of about 300 Å to about 1000 Å. However, the thickness of the first sacrificial layer 106 according to the inventive concepts is not limited to the above range.

When the second sacrificial layer 110 is etched, the second etch stop layer 108 may serve as an etching end point. Also, in a subsequent polishing process, the second etch stop layer 108 may serve as a polishing end point. If a thickness of the second etch stop layer 108 is less than about 100 Å, the second etch stop layer 108 may not function properly as the etching end point or the polishing end point, because the second etch stop layer 108 may be consumed during the etching and polishing processes. On the other hand, if the thickness of the second etch stop layer 108 is greater than about 500 Å, a processing time for removing the second etch stop layer 108 may be unnecessarily increased. Thus, in a preferred range, the second etch stop layer 108 may be formed to have a thickness of about 100 Å to about 500 Å. However, the thickness of the second etch stop layer 108 according to the inventive concepts is not limited to the above range.

The second sacrificial layer 110 may be used to subsequently form a capping spacer 120 (see FIG. 7), and the second sacrificial layer 110 may thus be formed to have a thickness substantially the same as, or greater than, a height of the capping spacer 120.

The first and second sacrificial layers 106 and 110 may be formed to include a material easily removable by a wet etching process. Also, the first and second etch stop layers 104 and 108 may be formed to include materials having etching selectivities with respect to the first and second sacrificial layers 106 and 110, respectively. The first and second sacrificial layers 106 and 110 may be formed to include, for example, silicon oxide, and the first and second etch stop layers 104 and 108 may be formed to include, for example, silicon nitride. The second sacrificial layer 106 may be planarized by a subsequent chemical mechanical polishing (CMP) process, and thus the second sacrificial layer 106 may be formed to include a material having sufficient strength to endure the CMP process. The first and second etch stop layers 104 and 108, and the first and second sacrificial layers 106 and 110, may be formed by a chemical vapor deposition (CVD) process.

Figure 3:
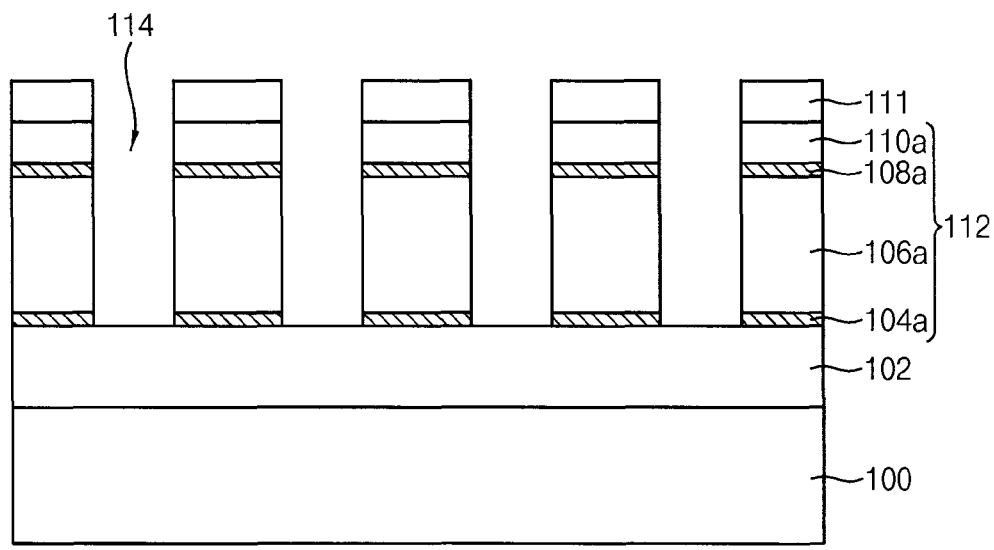

Referring to FIG. 3, an etch mask 111 may be formed on the second sacrificial layer 110. The etch mask 111 may include a photoresist pattern.

The second sacrificial layer 110, the second etch stop layer 108, the first sacrificial layer 106, and the first etch stop layer 104 may be sequentially etched using the etch mask 111 to form a mold structure 112 having one or more holes 114 arranged therethrough. In example embodiments, a plurality of holes 114 exposing respective ones of the plurality of contact regions on the lower structure 102, may be formed through the mold structure 112. The mold structure 112 may include a first etch stop layer pattern 104a, a first sacrificial layer pattern 106a, a preliminary second etch stop layer pattern 108a, and a second sacrificial layer pattern 110a, which are sequentially stacked. The mold structure 112 may be used in forming the first lower electrode 118a having a pillar shape. After forming the mold structure 112, the etch mask 111 may be removed.

Figure 4:
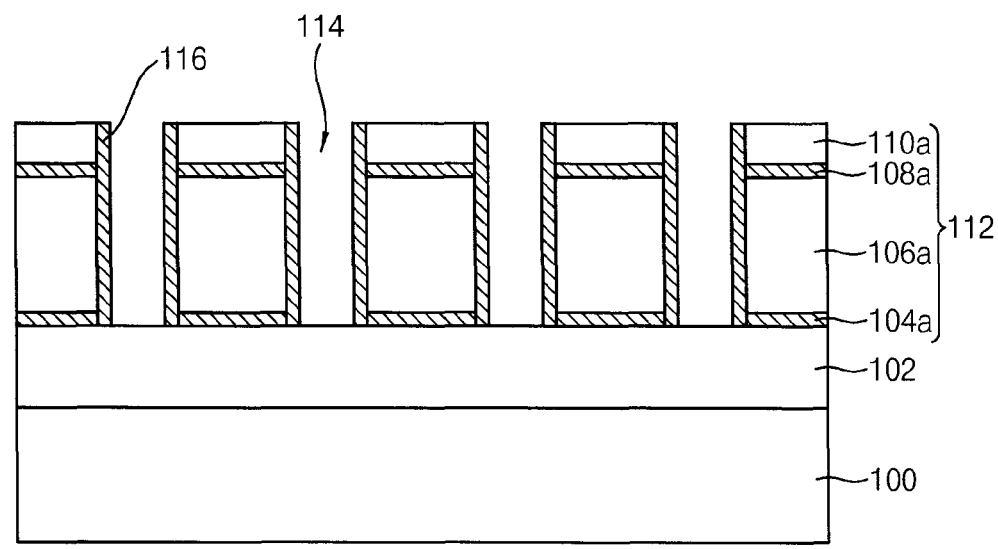

Referring to FIG. 4, a protection layer may be formed on a surface of the mold structure 112 and an upper surface of the lower structure 102. The protection layer may be formed to include a material having an etching selectivity with respect to the first and second sacrificial layer patterns 106a and 110a, so that the protection layer may be selectively etched later. In example embodiments, the first and second sacrificial layer patterns 106a and 110a may be formed to include silicon oxide, for example, and the protection layer may be formed to include silicon nitride, for example.

The protection layer may be anisotropically etched to form a protection layer pattern 116 and to expose an upper surface of the lower structure 102. In example embodiments, a plurality of protection layer patterns 116 may be formed on sidewalls of the holes 114, respectively. The protection layer patterns 116 may protect sidewalls of subsequently formed first lower electrodes 118a.

Figure 5:
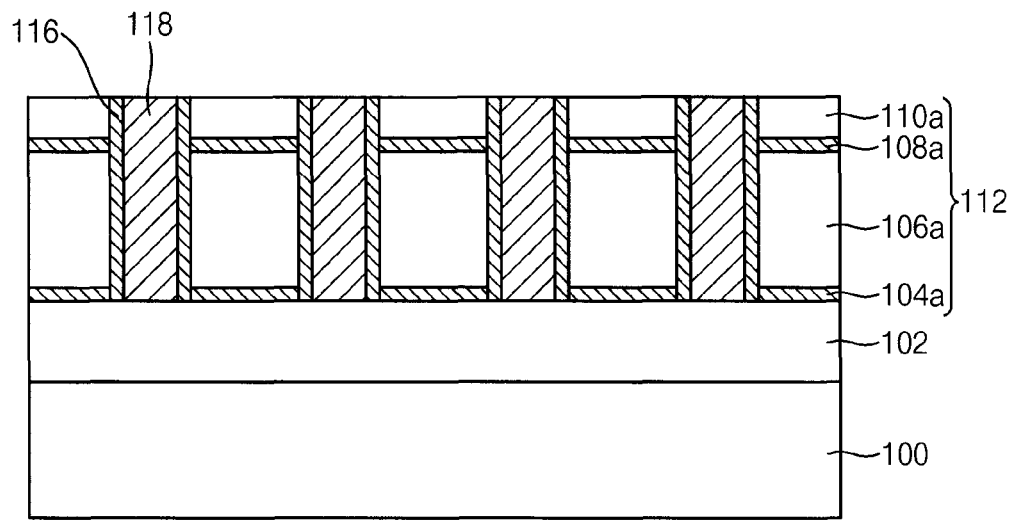

Referring to FIG. 5, a conductive layer may be formed on the exposed upper surface of the lower structure 102 and the mold structure 112 to sufficiently fill the hole 114. The conductive layer may be formed to include a metal (e.g., tungsten, titanium, or tantalum) and/or a metal nitride (e.g., tungsten nitride, titanium nitride, tantalum nitride, etc.).

An upper portion of the conductive layer may be planarized until a top surface of the mold structure 112 is exposed to form a first preliminary lower electrode 118 in the hole 114. In example embodiments, a plurality of first preliminary lower electrodes 118 may be formed in the plurality of holes 114, respectively. In the planarization process, an upper portion of the mold structure 112 may be also removed, and thus a thickness of the second sacrificial layer pattern 110a may be reduced. The planarization process may include, for example, a CMP process and/or an etch back process. Using the planarization process, the first preliminary lower electrode 118 and the second sacrificial layer pattern 110a may be formed to have substantially flat top surfaces.

In example embodiments, after the mold structure 112 is formed having the holes 114, the first preliminary lower electrodes 118 may be formed in the holes 114. The second sacrificial layer pattern 110a may include a material having sufficient strength to endure the CMP process, and thus the CMP process may be performed on the overall substrate 100 having the second sacrificial layer pattern 110a and the mold structure 112 thereon. Therefore, the mold structure 112 may be formed to have a substantially flat top surface in a first region of the substrate 100, which may be at a central portion of a memory cell region, and in a second region of the substrate 100, which may be at an edge portion of the memory cell region adjacent to a peripheral circuit region. The first preliminary lower electrodes 118 may have a first density in the first region, and may have a second density in the second region. The second density may be lower than the first density.

Figure 6:
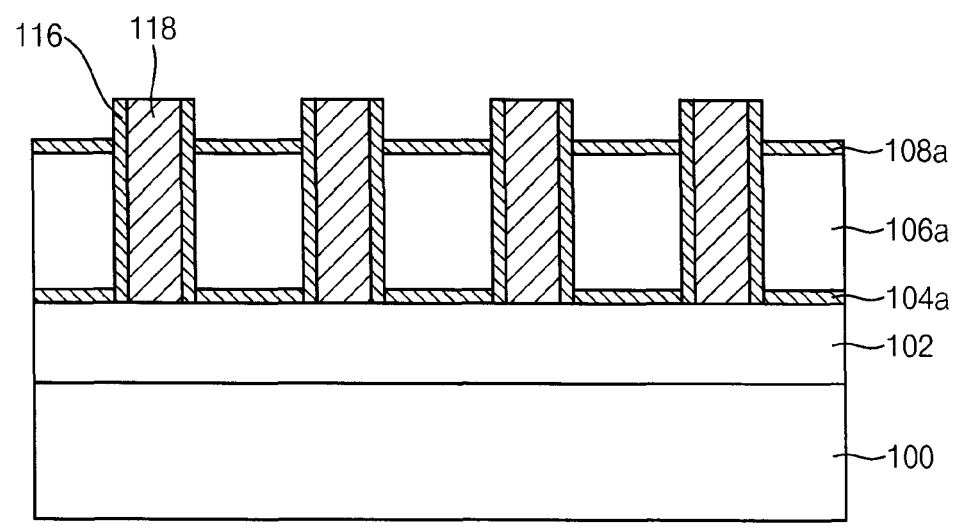

Referring to FIG. 6, the second sacrificial layer pattern 110a may be removed. In example embodiments, the second sacrificial layer pattern 110a may be removed by a wet etching process, and may therefore be removed without plasma damage. In the wet etching process, an etchant may include diluted hydrofluoric acid, for example. Using the wet etching process, the second sacrificial layer pattern 110a may be completely or substantially completely removed so as to expose the preliminary second etch stop layer pattern 108a and the protection layer pattern 116.

The second sacrificial layer pattern 110a may be selectively removed using the preliminary second etch stop layer pattern 108a as an etching stop layer, and thus the first sacrificial layer pattern 106a under the preliminary second etch stop layer pattern 108a may not be etched. Therefore, the first sacrificial layer pattern 106a may maintain a substantially uniform thickness even after the etching process. Also, a portion of first preliminary lower electrode 118 protruding from the preliminary second etch stop layer pattern 108a may have a substantially uniform thickness.

Figure 7:
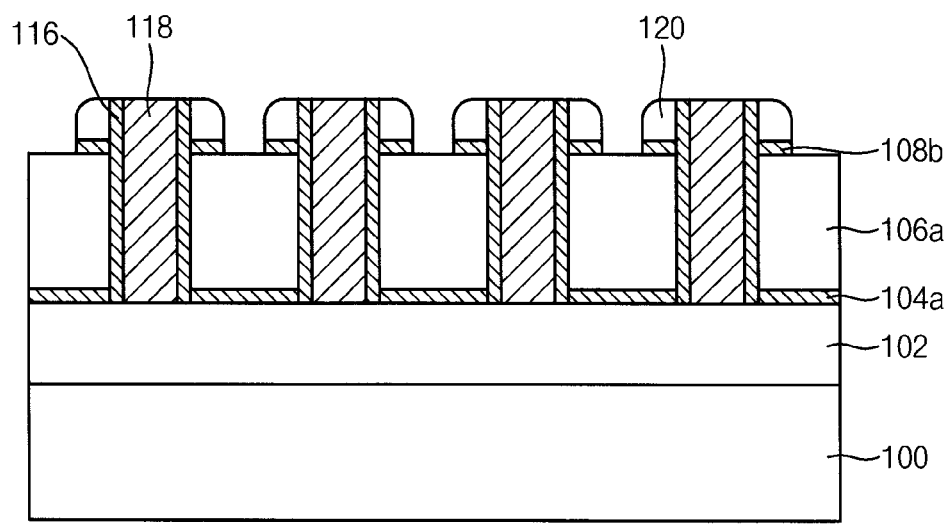
Figure 14:
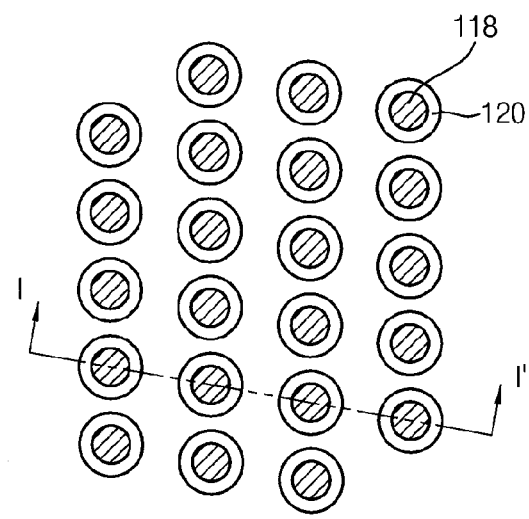

Referring to FIGS. 7 and 14, a spacer layer may be conformally formed on the protection layer pattern 116, the preliminary second etch stop layer pattern 108a, and the first preliminary lower electrode 118. The spacer layer may be formed to have a relatively thin thickness. In an example embodiment, the spacer layer may be formed by an atomic layer deposition (ALD) process. The spacer layer may be formed to include an insulating material substantially the same as that of the preliminary second etch stop layer pattern 108a, or different from that of the preliminary second etch stop layer pattern 108a. The spacer layer may, for example, be formed to include silicon oxide or silicon nitride. In the present embodiment, the spacer layer may include silicon oxide.

The spacer layer may be anisotropically etched to form the capping spacer 120 on a sidewall of the first preliminary lower electrode 118 and to expose a portion of the preliminary second etch stop layer pattern 108*a*. In example embodiments, a plurality of capping spacers 120 may be formed on the sidewalls of the plurality of first preliminary lower electrodes 118, respectively. The exposed portion of the preliminary second etch stop layer pattern 108*a* may be removed to form a second etch stop layer pattern 108*b*. In example embodiments, a plurality of second etch stop layer patterns 108*b* may be formed on and protrude from the sidewalls of the first preliminary lower electrodes 118, respectively. The second etch stop layer pattern 108*b* may have a substantially ring shape surrounding the first preliminary lower electrode 118. Also, a top surface of the first sacrificial layer pattern 106*a* between the second etch stop layer patterns 108*b* may be exposed.

Figure 8:
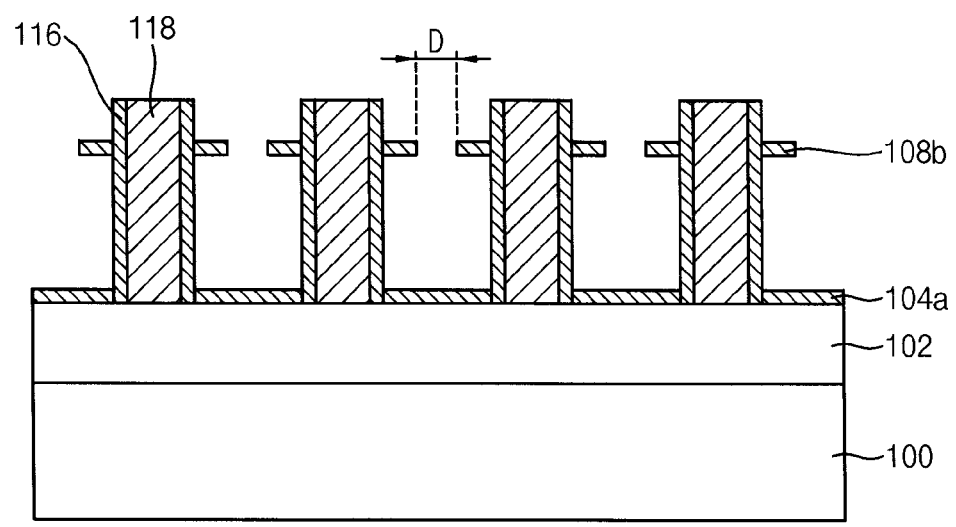
Figure 15:
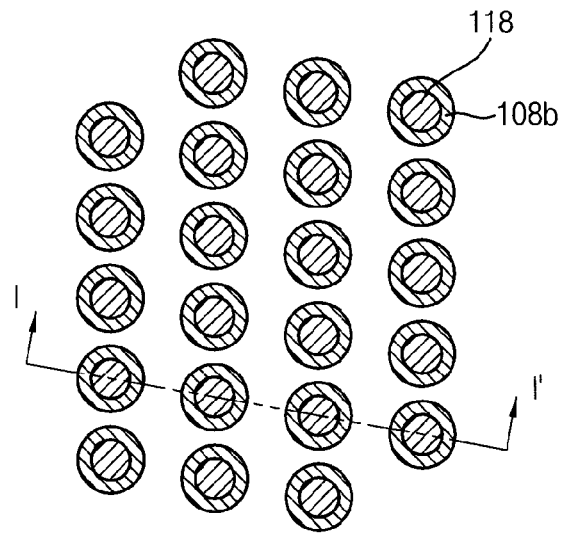

Referring to FIGS. 8 and 15, the first sacrificial layer pattern 106*a* may be removed by an etching process, such as a wet etching process. That is, an etchant may permeate through the exposed first sacrificial layer pattern 106*a* between the capping spacers 120, and thus the first sacrificial layer pattern 106*a* may be sufficiently removed. In the wet etching process, the etchant may include diluted hydrofluoric acid, for example. The second etch stop layer pattern 108*b* and the protection layer pattern 116 may not be etched in the wet etching process.

In example embodiments, when the capping spacer 120 includes silicon oxide, the capping spacer 120 may be also removed by the etching process for etching the first sacrificial layer pattern 106*a*. Therefore, the second etch stop layer pattern 108*b* and the protection layer pattern 116 may remain on the sidewall of the first preliminary lower electrode 118. Also, the second etch stop layer pattern 108*b* may protrude from the sidewall of the first preliminary lower electrode 118. A distance D between the second etch stop layer patterns 108*b* may be smaller than a distance between the protection layer patterns 116 on the sidewalls of the first preliminary lower electrodes 118.

Figure 9:
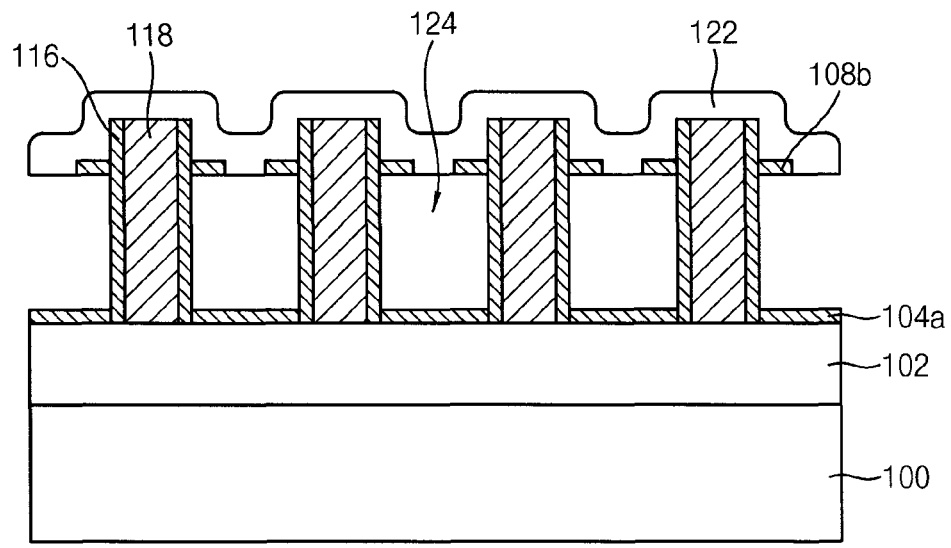
Figure 16:
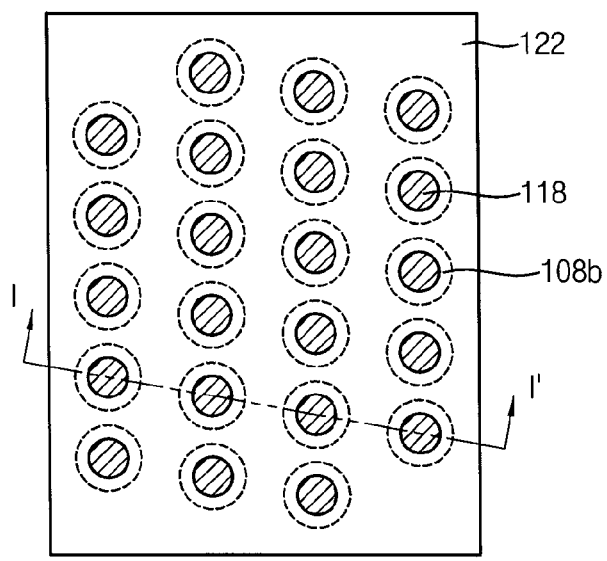

Referring to FIGS. 9 and 16, an upper insulating layer 122 may be formed to fill a first space between adjacent second etch stop layer patterns 108*b*, but may not fill a second space between adjacent portions of the protection layer patterns 116 on lower sidewalls of the first preliminary lower electrodes 118 under the second etch stop layer patterns 108*b*. The upper insulating layer 122 may be formed by a deposition process having poor step coverage characteristics. Because the first spaces between the second etch stop layer patterns 108*b* may be relatively small, the upper insulating layer 122 may be formed to fill only the first spaces by controlling the deposition process conditions. The upper insulating layer 122 may be formed to include silicon oxide or silicon nitride, for example. In example embodiments, the upper insulating layer 122 may be formed to include a material having a polishing selectivity with respect to the second etch stop layer pattern 108*b*, which may, for instance, include silicon oxide.

The upper insulating layer 122 may fill the first spaces between the second etch stop layer patterns 108*b*, thereby forming air pads 124 in the second spaces located between the portions of the protection layer patterns 116 on the lower sidewalls of the first preliminary lower electrodes 118 under the second etch stop layer patterns 108*b*. That is, an air pad 124 may be formed in the space from which the first sacrificial layer pattern 106*a* was previously removed.

Although the density of the first preliminary lower electrodes 118 may vary depending on the region of the substrate 100 on which they are formed, the thickness of the first sacrificial layer pattern 106*a* may be substantially uniform. A volume of the air pad 124 may therefore be substantially uniform on the substrate 100 regardless of the region on which it is arranged.

Figure 10:
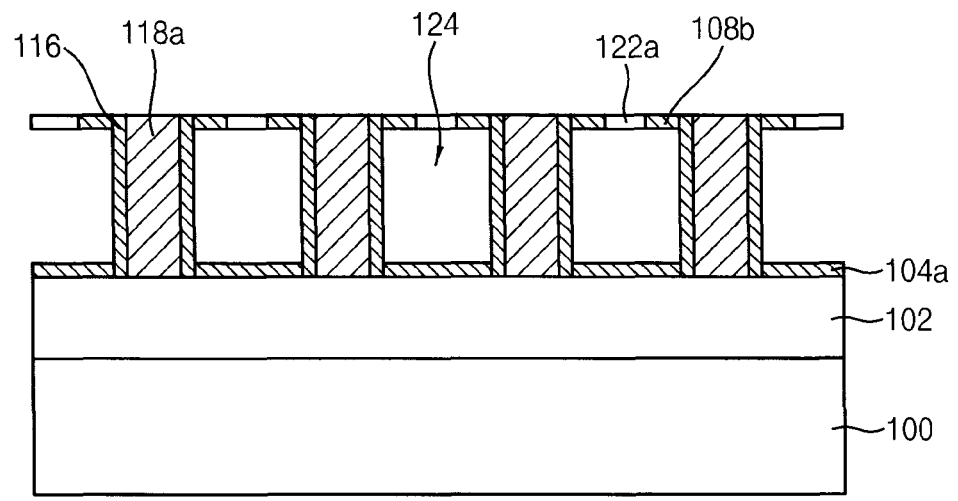
Figure 17:
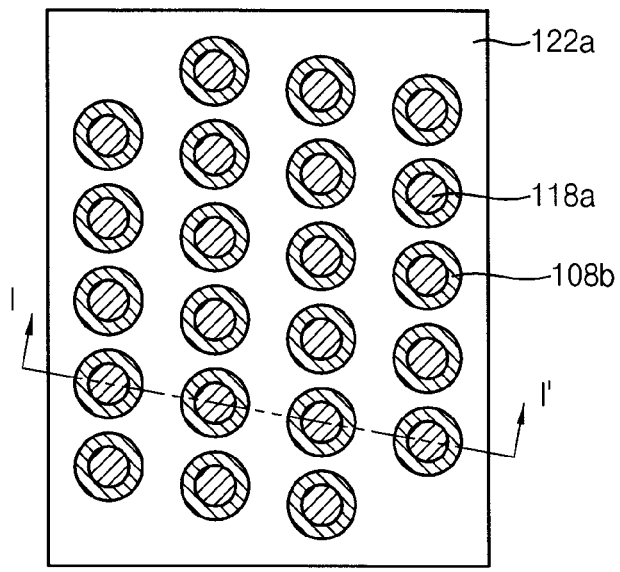

Referring to FIGS. 10 and 17, the upper insulating layer 122 may be planarized until an upper surface of the second etch stop layer pattern 108*b* is exposed, thereby forming an upper insulating layer pattern 122*a*. The planarization process may, for instance, include a CMP process and/or an etch back process. In the planarization process, an upper portion of the first preliminary lower electrode 118 may also be removed so as to form the first lower electrode 118*a*. Thus, the second etch stop layer pattern 108*b* and the upper insulating layer pattern 122*a* may be formed between portions of the protection layer pattern 116 on upper portions of sidewalls of the first lower electrodes 118*a*. Also, the air pad 124 may be formed under the second etch stop layer pattern 108*b* and the upper insulating layer pattern 122*a*.

When the upper insulating layer 122 includes silicon oxide, the planarization process may be performed until the upper surface of the second etch stop layer pattern 108*b* is exposed, so that the upper insulating layer 122 and the first preliminary lower electrode 118 may be polished using the second etch stop layer pattern 108*b* as a polishing end point.

Alternatively, when the upper insulating layer 122 includes silicon nitride, the planarization process may be performed until a top surface of the first preliminary lower electrode layer 118 is exposed by controlling a polishing time. Thus, portions between the protection layer patterns 116 on upper portions of sidewalls of the first lower electrodes 118*a* may be covered with the second etch stop layer pattern 108*b* and the upper insulating layer pattern 122*a*.

The upper insulating layer 122 may be planarized by a CMP process, so that thicknesses of the second etch stop layer pattern 108*b* and the upper insulating layer pattern 122*a* on the air pad 124 may be substantially uniform.

Figure 11:
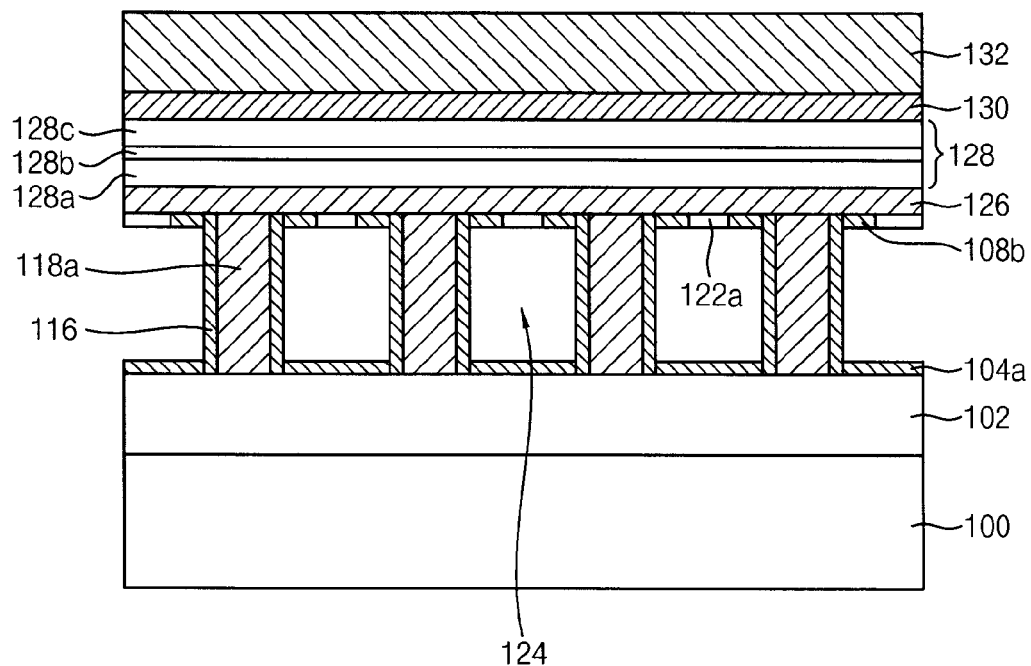

Referring to FIG. 11, a second lower electrode layer 126 may be formed on the first lower electrode 118*a*, the second etch stop layer pattern 108*b*, and the upper insulating layer pattern 122*a*. An MTJ layer 128 may be formed on the second lower electrode layer 126. The MTJ layer 128 may be formed to include a first magnetic layer 128*a*, a tunnel barrier layer 128*b*, and a second magnetic layer 128*c*. A magnetization direction of the first and second magnetic layers 128*a* and 128*c* in the MTJ layer 128 may be a vertical or a horizontal direction. A capping layer 130 may be formed on the second magnetic layer 128*c*. An upper electrode layer 132 may be formed on the capping layer 130.

The second lower electrode layer 126 may be formed to include a metal (e.g., tungsten, titanium, tantalum, etc.) and/or a metal nitride (e.g., tungsten nitride, titanium nitride, tantalum nitride, etc.). The second lower electrode layer 126 may be formed between the first lower electrode 118*a* and the MTJ layer 128, so that the second lower electrode layer 126 may protect the MTJ layer 128. In some example embodiments, the second lower electrode layer 126 need not be formed.

The first magnetic layer 128*a* may serve as a fixed layer having a fixed magnetization direction. The first magnetic layer 128*a* may be formed to include a magnetic material including a transition metal, for example. The first magnetic layer 128*a* may, for instance, include Pd, Co, Pt, Fe, Ru, Ta, Ni, B, Mn, Sb, AlCr, Mo, Si, Cu, Ir, or an alloy of at least two of any of these materials. In an example embodiment, the first magnetic layer 128a may include one or more of CoFe, NiFe, CoFeB, etc. The first magnetic layer 128a may be formed to have a single layer structure or a multi-layered structure.

The tunnel barrier layer 128b may, for instance, be formed to include MgO or AlOx. The tunnel barrier layer 128b may form a tunnel barrier so that a quantum mechanical tunneling may be generated between the first magnetic layer 128a and the second magnetic layer 128c. The tunnel barrier layer 128b may be formed to have a thin thickness of about 1 Å to about 100 Å.

The second magnetic layer 128c may serve as a free layer of which a magnetization direction may be changed. The second magnetic layer 128c may be formed to include a magnetic material including a transition metal. The second magnetic layer 128c may, for instance, include Pd, Co, Pt, Fe, Ru, Ta, Ni, B, Mn, Sb, AlCr, Mo, Si, Cu, Ir, or an alloy of at least two of any of these materials. In an example embodiment, the second magnetic layer 128c may include one or more of CoFe, NiFe, CoFeB, etc. The second magnetic layer 128c may be formed to have a single layer structure or a multi-layered structure. The second magnetic layer 128c may be formed to have a thickness thinner than that of the first magnetic layer 128a.

The capping layer 130 may protect an upper portion of the MTJ layer 128. The capping layer 130 may be formed to include Ti, Ta, Tan, TaN, etc. The capping layer 130 may be formed to have a single layer structure or a multi-layered structure.

The upper electrode layer 132 may be formed to include a metal (e.g., W) and/or a metal nitride (e.g., WN, etc.).

The upper electrode layer 132 may serve as an etching mask in a process for etching the MTJ layer 128. The upper electrode layer 132 may be formed to have a thickness thicker than that of a subsequently formed upper electrode 132a (see FIG. 12), so that the upper electrode layer 132 may not be completely consumed during the etching process. Also, the upper electrode layer 132 may be formed to have a thickness larger than that of the capping layer 130.

Figure 12:
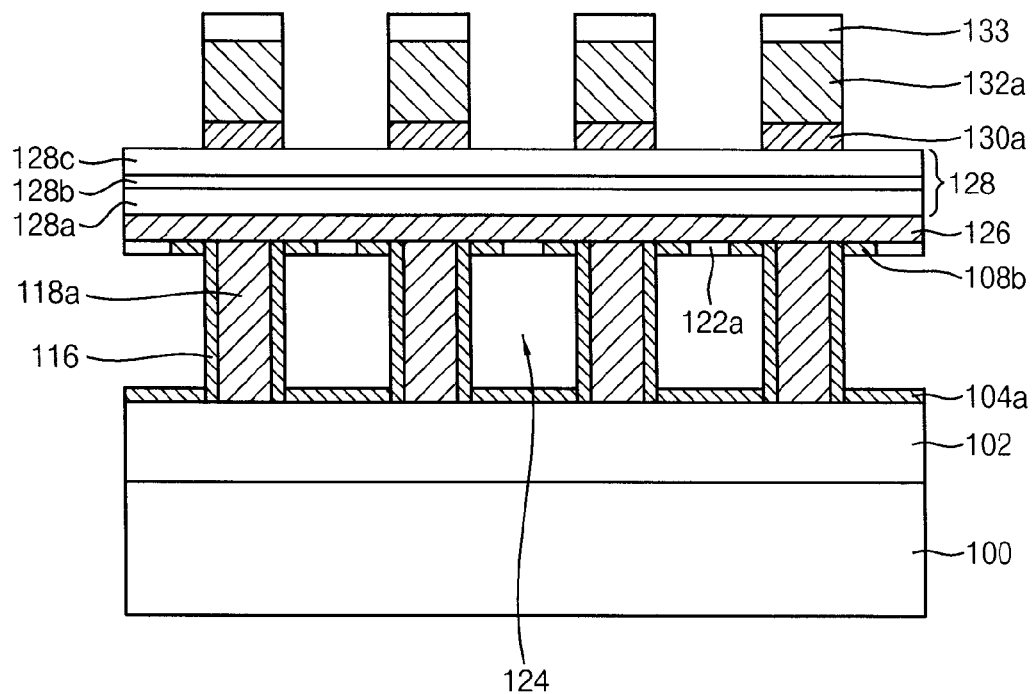

Referring to FIG. 12, a hard mask layer may be formed on the upper electrode layer 132. A photoresist pattern (not shown) may be formed on the hard mask layer by a coating, exposing, and developing process for a photoresist film (not shown). The hard mask layer may be etched using the photoresist pattern as an etching mask to form a hard mask 133. The hard mask 133 may be formed to include silicon nitride, for example. The hard mask 133 may overlap the first lower electrodes 118a.

The upper electrode layer 132 may be etched using the hard mask 133 as an etching mask to form an upper electrode 132a. In example embodiments, a plurality of upper electrodes 132a may be formed. The capping layer 130 may be etched to form a capping layer pattern 130a. In example embodiments, a plurality of capping layer patterns 130a may be formed. The hard mask 133 may be substantially or completely removed during the etching processes.

Figure 13:
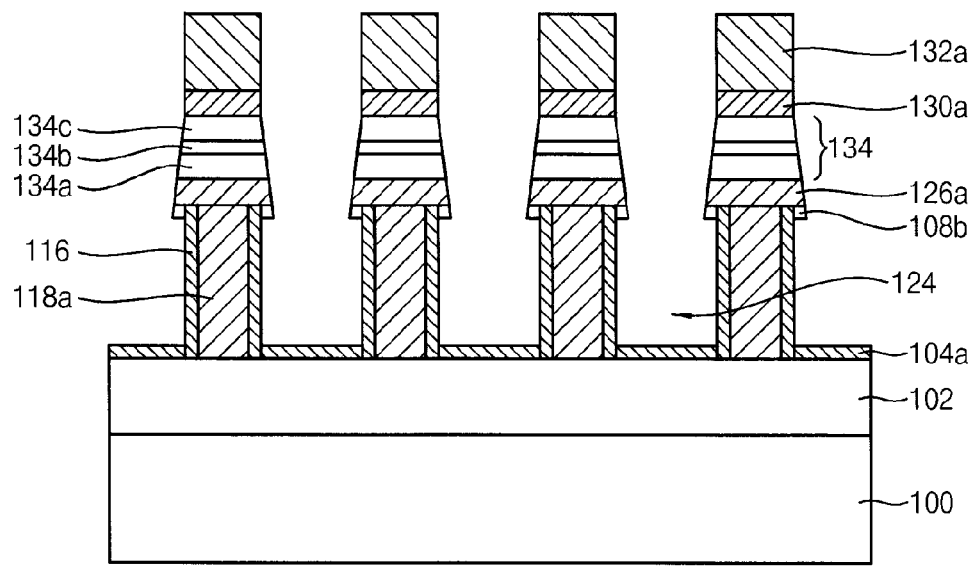

Referring to FIG. 13, the second magnetic layer 128c, the tunnel barrier layer 128b, and the first magnetic layer 128a may be sequentially etched using the upper electrode 132a as an etching mask to form an MTJ pattern 134 including a sequentially stacked first magnetic layer pattern 134a, tunnel barrier layer pattern 134b, and second magnetic layer pattern 134c, and to expose a portion of the second lower electrode layer 126. In example embodiments, a plurality of MTJ patterns 134 may be formed. The first magnetic layer pattern 134a may serve as a fixed layer pattern, and the second magnetic layer pattern 134c may serve as a free layer pattern.

The exposed portion of the second lower electrode layer 126, and portions of the second etch stop layer pattern 108b and the upper insulating layer pattern 122a arranged thereunder, may be sequentially etched. When the second etch stop layer pattern 108b and the upper insulating layer pattern 122a are etched, the air pad 124 may be opened. The upper insulating layer pattern 122a may have a substantially uniform thickness, and thus the air pad 124 may be easily opened by the etching process. Using the etching processes, an MTJ structure may be formed including a second electrode pattern 126a, the MTJ pattern 134, the capping layer pattern 130a, and the upper electrode 132a, which are sequentially stacked on the first lower electrode 118a. The second etch stop layer pattern 108b may remain on the portion of the protection layer pattern 116 on the upper portions of sidewalls of the first lower electrode 118a.

As the MTJ layer 128 may include a magnetic material, the MTJ layer 128 may be etched by a physical etching process, such as an ion beam etching process. In an example embodiment, the MTJ layer 128 may be etched by an argon ion sputter etching process. The second lower electrode layer 126 may also be etched by the ion beam etching process.

When the MTJ layer 128 is etched using the ion sputter etching process, a removed portion of the MTJ layer 128 may be re-deposited on a sidewall or a bottom surface of the MTJ pattern 134, which may generate process failures due to the conductivity of the magnetic material from the MTJ layer 128. For example, when the magnetic material is re-deposited between the MTJ structures, the MTJ structures may be electrically shorted.

In a conventional structure, without an air pad formed therein, an insulating layer pattern including an insulating material may be formed under the second lower electrode layer. Thus, when the second electrode layer is patterned, the magnetic material may be re-deposited on the insulating layer pattern between the second lower electrodes. Accordingly, the second lower electrodes may be electrically shorted to each other.

However, in example embodiments of the present inventive concepts, an air pad 124 may be formed between adjacent ones of the first lower electrodes 118a. Thus, when the MTJ layer 128, the second lower electrode layer 126, the second etch stop layer pattern 108b, and the upper insulating layer pattern 122a are sequentially etched, the air pad 124 may be exposed between the first lower electrodes 108a. In this way, even though a magnetic material may be re-deposited on the second etch stop layer pattern 108b and the upper insulating layer pattern 122a during the etching process, the MTJ structure may not be electrically shorted because the second etch stop layer pattern 108b and upper insulating layer pattern 122a may be physically separated during the etching process. Also, a depth of a space between the MTJ patterns 134 may be deepened by the air pad 124, and thus an area on which the magnetic material may be re-deposited may be widened. Therefore, the risk of an electrical short between the MTJ structures due to the re-deposited magnetic material may be substantially reduced.

If the thicknesses of the second etch stop layer patterns 108b and the upper insulating layer patterns 122a are not sufficiently uniform on the substrate 100, the air pad 124 may not be opened at areas at which the second etch stop layer patterns 108b and the upper insulating layer patterns 122a have relatively large thicknesses. This may also result in the MTJ structures being electrically shorted. However, in example embodiments of the present inventive concepts, the second etch stop layer patterns 108b and upper insulating layer patterns 122a may be substantially uniform in all areas of the substrate 100, so that the air pad 124 between the first lower electrodes 118a may be easily opened by the etching process, and the risk of an electrical short due to the re-deposited magnetic material may be reduced.

In example embodiments, the air pad 124 may have a substantially uniform volume in all areas of the substrate 100, and the layers on the air pad 124 may have substantially uniform thicknesses. Thus, the risk of causing an electrical short due to the magnetic material re-deposited during the ion sputtering process for forming the MTJ structure may be reduced.

FIGS. 18 to 21 are cross-sectional views illustrating various stages of another method of forming the MTJ structure of FIG. 1 according to additional principles of the inventive concepts.

This method may be substantially the same as, or similar to, those described previously with reference to FIGS. 2 to 13, except for with respect to the process of forming the spacer layer using silicon nitride.

According to this method, processes substantially the same as, or similar to, those described previously with reference to FIGS. 2 to 6 may first be performed.

Figure 18:
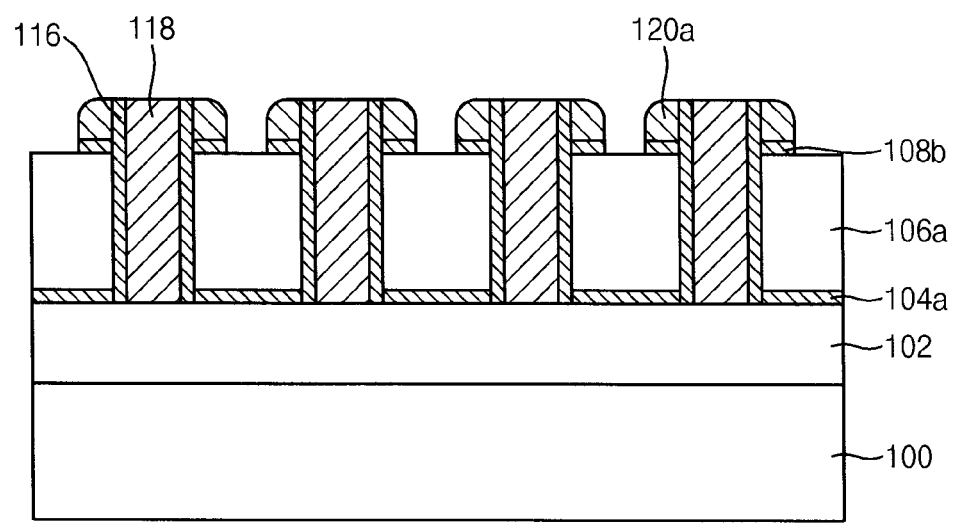

Now, referring to FIG. 18, a spacer layer may be formed on the protection layer pattern 116, the preliminary second etch stop layer pattern 108a, and the first preliminary lower electrode 118. In an example embodiment, the spacer layer may be formed by an atomic layer deposition (ALD) process. The spacer layer may be formed to include an insulating material, such as silicon nitride. That is, the spacer layer may be formed using substantially the same material as the protection layer pattern 116 and the preliminary second etch stop layer pattern 108a.

The spacer layer may be anisotropically etched to form a capping spacer 120a on a sidewall of the first preliminary lower electrode 118, and to expose a portion of the preliminary second etch stop layer pattern 108a. The exposed portion of the preliminary second etch stop layer pattern 108a may be removed to form a second etch stop layer pattern 108b.

Figure 19:
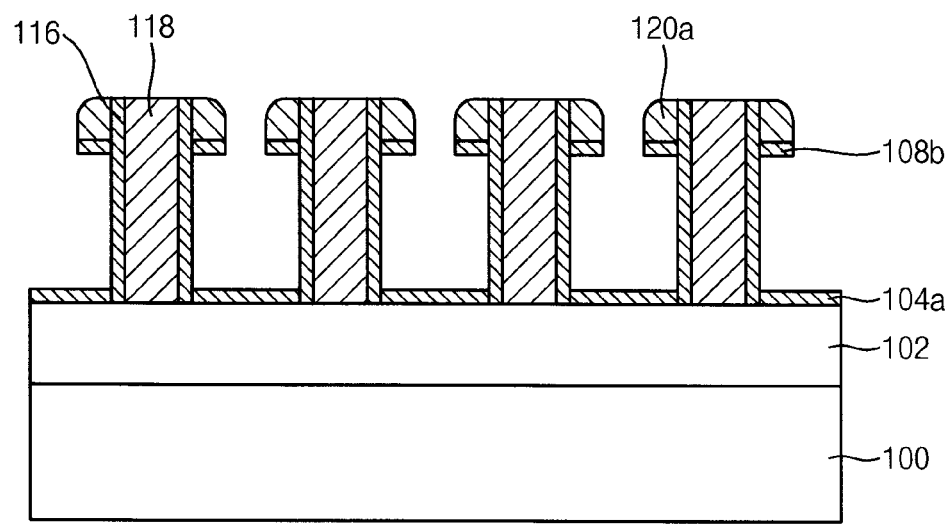

Referring to FIG. 19, the first sacrificial layer pattern 106a may be removed by an etching process such as a wet etching process, for example. That is, an etchant may permeate through the exposed first sacrificial layer pattern 106a between the capping spacers 120a, and the first sacrificial layer pattern 106a may thereby be sufficiently removed. In the wet etching process, the etchant may, for instance, include diluted hydrofluoric acid. The second etch stop layer pattern 108b, the protection layer pattern 116, and the capping spacers 120a may not be etched during the wet etching process.

Figure 20:
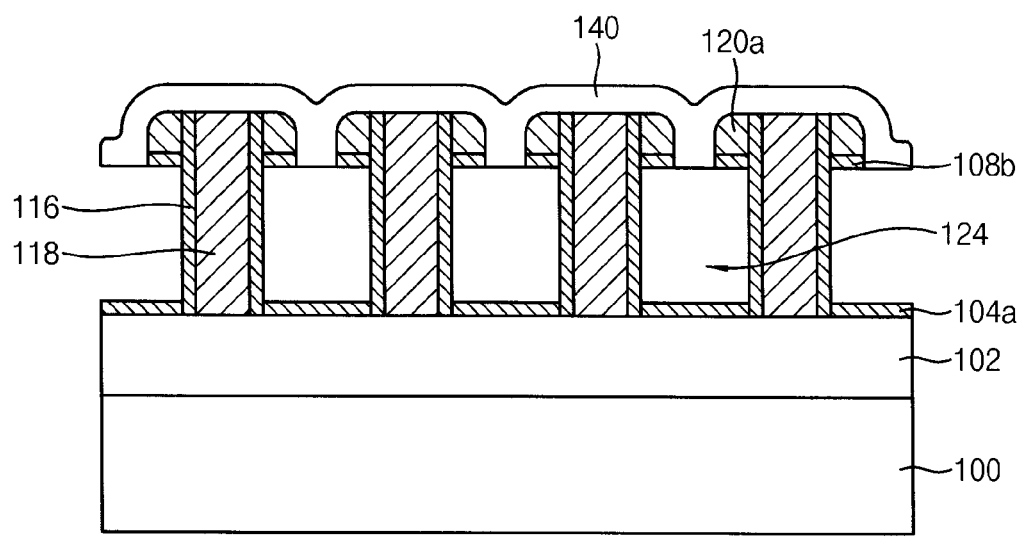

Referring to FIG. 20, an upper insulating layer 140 may be formed to fill a first space between adjacent ones of the second etch stop layer patterns 108b. The upper insulating layer 140 may not, however, fill a second space between adjacent portions of the protection layer patterns 116 on lower sidewalls of the first preliminary lower electrodes 118 under the second etch stop layer patterns 108b. As the first spaces between the second etch stop layer patterns 108b may be relatively small, the upper insulating layer 140 may be formed to fill only the first spaces by controlling the deposition process conditions. The upper insulating layer 140 may be formed to include silicon oxide or silicon nitride, for example.

By filling the first spaces between the second etch stop layer patterns 108b using the upper insulating layer 140, an air pad 124 may be formed in each of the second spaces located between the portions of the protection layer patterns 116 on the lower sidewalls of the first preliminary lower electrodes 118 under the second etch stop layer patterns 108b.

Figure 21:
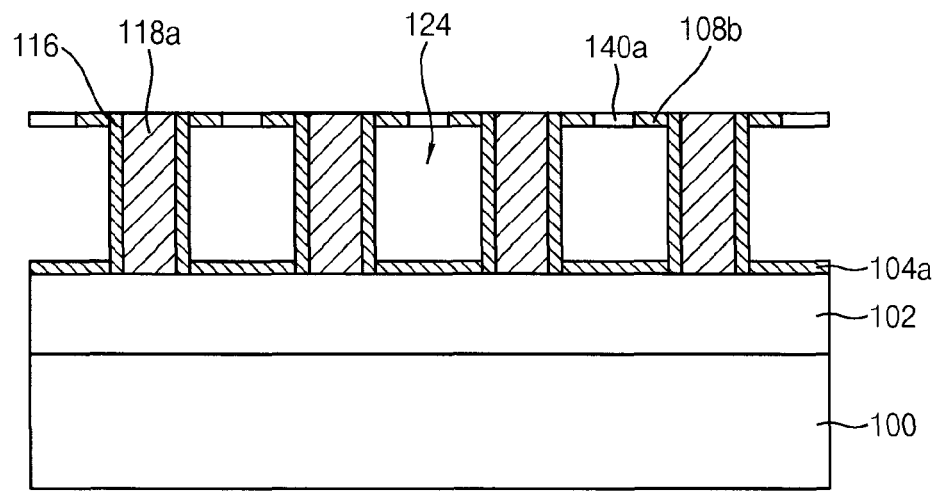

Referring to FIG. 21, the upper insulating layer 140 may be planarized until an upper surface of the second etch stop layer pattern 108b is exposed to form an upper insulating layer pattern 140a. The planarization process may include a CMP process and/or an etch back process, for example. In the planarization process, an upper portion of the first preliminary lower electrode 118 may also be removed so as to form a first lower electrode 118a.

When the upper insulating layer 140 includes silicon oxide, the planarization process may be performed until the upper surface of the capping spacer 120a may be exposed.

Alternatively, when the upper insulating layer 140 includes silicon nitride, the planarization process may be performed until a top surface of the first preliminary lower electrode layer 118 is exposed by controlling a polishing time. Thus, portions between the protection layer patterns 116 on upper portions of sidewalls of the first lower electrodes 118a may be covered with the second etch stop layer pattern 108b and the upper insulating layer pattern 140a.

Then, processes substantially the same as, or similar to, those described previously with reference to FIGS. 11 to 13 may be performed to form the MTJ structure of FIG. 1.

The MTJ structure of FIG. 1 may be included in memory cells of an MRAM device.

Figure 22:
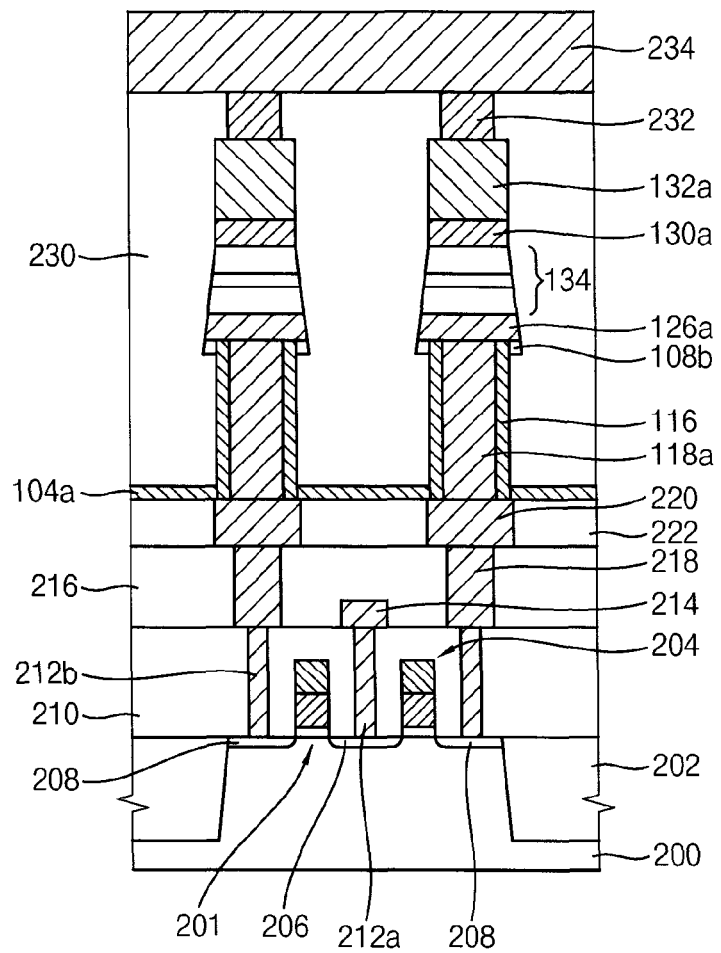

FIG. 22 is a cross-sectional view of an STT-MRAM device constructed in accordance with example embodiments.

Referring to FIG. 22, an active region and an insulation region may be defined on a substrate 200 by an isolation layer pattern 202. A metal oxide semiconductor (MOS) transistor may be formed on the substrate 200. The MOS transistor may, for example, include a planar gate type transistor or a recess gate type transistor.

A gate electrode 204 of the MOS transistor may serve as a word line. When the MOS transistor is a planar gate type transistor, a gate spacer (not shown) may be formed at a sidewall of the gate electrode 204. The gate electrode 204 may extend in a direction substantially perpendicular to a direction of a channel length in the MOS transistor, and a plurality of gate electrodes 204 may be formed. An impurity region between the gate electrodes 204 may serve as a common source region 206.

A first insulating interlayer 210 may be formed on the substrate 200 to cover the MOS transistor. Also, a first contact plug 212a contacting the common source region 206, and a second contact plug 212b contacting a drain region 208, may be formed through the first insulating interlayer 210. A source line 214 may be formed on the first insulating interlayer 210 to be electrically connected to the first contact plug 212a.

A second insulating interlayer 216 may be formed on the substrate 200 to cover the source line 214. Also, a third contact plug 218 contacting the second contact plug 212b may be formed through the second insulating interlayer 216. A plurality of pad patterns 220 may be formed on a plurality of third contact plugs 218, respectively. A third insulating interlayer pattern 222 may be formed on the second insulating interlayer 216 to surround sidewalls of the pad patterns 220. The pad patterns 220 and the third insulating interlayer pattern 222 may have substantially flat top surfaces.

The MTJ structures of FIG. 1 may be formed on the pad patterns 220, respectively. The MTJ structures may be arranged in a regular and dense pattern.

A first lower electrode 118a may contact a top surface of the pad pattern 118a. The first lower electrode 118a may have a substantially pillar-shape structure. The first lower electrode 118a may include a metal.

A protection layer pattern 116 may be formed on a sidewall of the first lower electrode 118a. A first etch stop layer pattern 104a may be formed on a lower structure between the first lower electrodes 118a. The protection layer pattern 116 and the first etch stop layer pattern 104a may include an insulating material. When the protection layer pattern 116 and the first etch stop layer pattern 104a include substantially the same material, the protection layer pattern 116 and the first etch stop layer pattern 104a may be merged into a single layer pattern.

A second lower electrode 126a, an MTJ pattern 134, a capping layer pattern 130a and an upper electrode 132a may be sequentially stacked on the first lower electrode 118a. A bottom surface of the second lower electrode 126a may be wider than a top surface of the first lower electrode 118a, or may be substantially the same width as the top surface of the first lower electrode 118a.

A second etch stop layer pattern 108b may be formed on an edge portion of the bottom surface of the second lower electrode 126a so as to contact an upper portion of the sidewall of the protection layer pattern 116. The second etch stop layer pattern 108b may have a substantially ring-shaped configuration surrounding an upper portion of the sidewall of the first lower electrode 118a.

A fourth insulating interlayer 230 may be formed on the first etch stop layer pattern 104a and the protection layer pattern 116 to surround the MTJ structures. A top electrode contact plug 232 may be formed through a portion of the fourth insulating interlayer 230 to contact the upper electrode 132a. A bit line 234 may be formed on the fourth insulating interlayer 230 to contact the top electrode contact plug 232.

Figure 23:
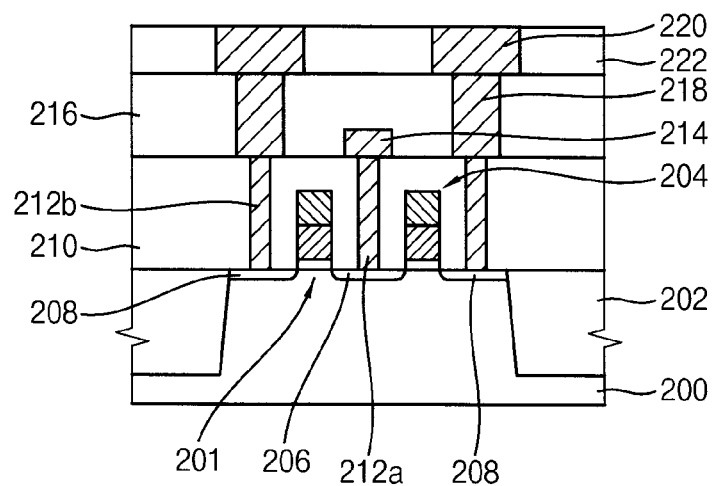
Figure 24:
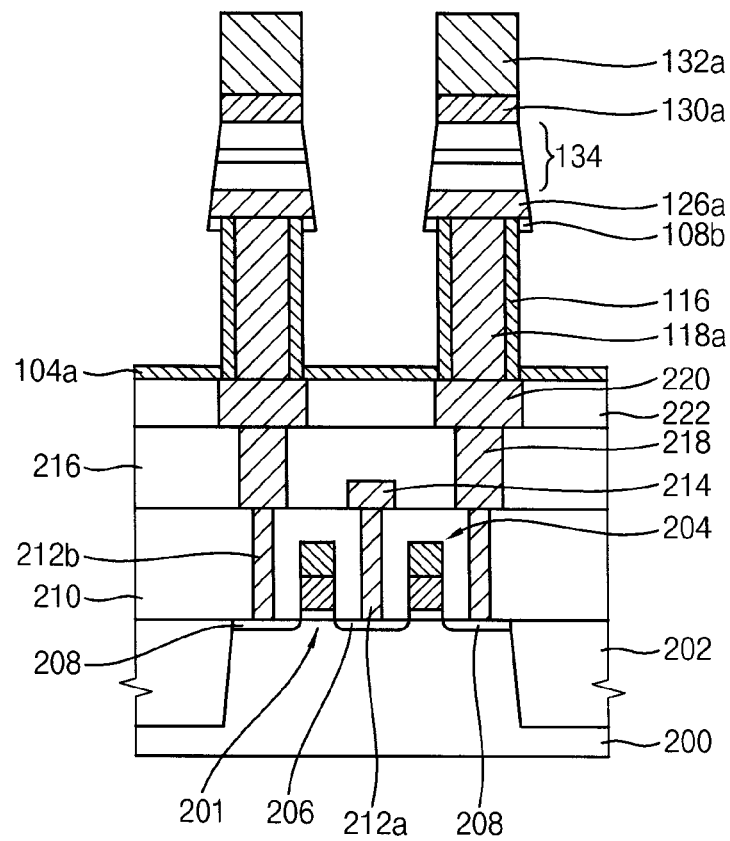
Figure 25:
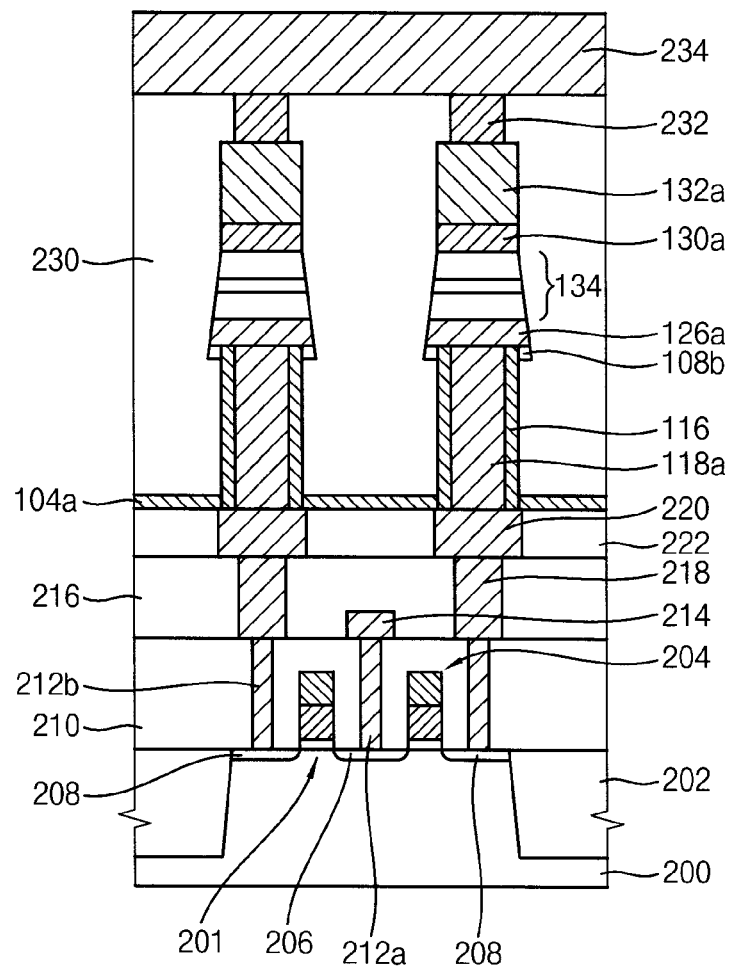

FIGS. 23 to 25 are cross-sectional views illustrating various stages of a method of manufacturing the STT-MRAM device of FIG. 22 according to further aspects of the inventive concepts.

Referring to FIG. 23, an isolation pattern 202 may be formed on a substrate 200 to define an active region and a field region in the substrate 200. An MOS transistor for selecting memory cells may be formed on the substrate 200.

For forming the MOS transistor, a gate oxide layer and a gate electrode layer may be formed on the substrate 200. The gate electrode layer may be patterned to form a gate electrode 204. Impurities may be doped into upper portions of the substrate 200 adjacent to the gate electrode 204 to form a common source region 206 and a drain region 208, respectively. The gate electrode 204 may serve as a word line and may extend in a first direction substantially perpendicular to a second direction in which the active region may extend. A gate spacer (not shown) may be formed at a sidewall of the gate electrode 204.

In example embodiments, two gate electrodes 204 may be formed in each active region. The common source region 206 may be formed at the upper portion of the substrate 200 between the two gate electrodes 204, and a drain region 208 may be formed at the upper portion of the substrate 200 adjacent to the isolation pattern 202 in the second direction.

A first insulating interlayer 210 may be formed on the substrate to cover the MOS transistor. A first contact plug 212a and a second contact plug 212b may be formed through the first insulating interlayer 210 to contact the source region 206 and the drain region 208, respectively. That is, the first contact plug 212a may contact the source region 206, and the second contact plug 212b may contact the drain region 208.

A conductive layer may be formed on the first insulating interlayer 210 and the first and second contact plugs 212a and 212b, and the conductive layer may be patterned to form a source line 214. The source line 214 may contact the first contact plug 212a, and may extend in the first direction.

A second insulating interlayer 216 may be formed on the first insulating interlayer 210 so as to cover the source line 214. A third contact plug 218 may be formed through the second insulating interlayer 216 to contact the second contact plug 212b.

A pad pattern 220 may be formed on the third contact plug 218. In example embodiments, a plurality of pad patterns 220 may be formed on the plurality of third contact plugs 218, respectively. A third insulating interlayer may be formed on the second insulating interlayer 216 to cover the pad patterns 220, and may be planarized to expose upper surfaces of the pad patterns 220 to form a third insulating interlayer pattern 222 surrounding sidewalls of the pad patterns 220. The planarization process may, for example, include a CMP process and/or an etch back process. In some embodiments, the pad pattern 220 and the third insulating interlayer pattern 222 may not be formed. Thus, the third contact plug 218 may directly contact a subsequently formed MTJ structure.

Referring to FIG. 24, the MTJ structure may be formed on the pad pattern 220 and the third insulating interlayer pattern 222. Processes for forming the MTJ structure may be substantially the same as, or similar to, those described previously with reference to FIGS. 2 to 13.

That is, a first etch stop layer, a first sacrificial layer, a second etch stop layer, and a second sacrificial layer may be sequentially formed on the pad pattern 220 and the third insulating interlayer pattern 222. The second sacrificial layer, the second etch stop layer, the first sacrificial layer, and the first etch stop layer may be etched to form a hole (not shown) therethrough. Thus, a first etch stop layer pattern, a first sacrificial layer pattern, a second etch stop layer pattern, and a second sacrificial layer pattern may be formed having the hole. A protection layer pattern 116 may be formed on a sidewall of the hole, and a first lower electrode 118a may be formed on the protection layer pattern 116 to fill the hole. That is, the first lower electrode 118a may be formed by a damascene process, and may have a substantially pillar-like shape. The second sacrificial layer pattern may be removed, and then a capping spacer may be formed on an exposed upper portion of the sidewall of the first lower electrode 118a. A lower portion of the first sacrificial layer pattern may be etched to form an air pad. An upper insulating layer may be formed to fill a space between portions of the protection layer patterns 116 and to leave the air pad open. The upper insulating layer may be planarized to expose a top surface of the first lower electrode 117a. A second lower electrode 126a, an MTJ pattern 134, a capping layer pattern 139a, and an upper electrode 132a may be formed on the first lower electrode. Because of the air pad, a risk of an electrical short between the MTJ structures due to the re-deposited magnetic material during an etching process may be reduced.

In alternate example embodiments, the MTJ structure may be formed by processes substantially the same as, or similar to, those described previously with reference to FIGS. 18 to 21.

Referring to FIG. 25, a fourth insulating interlayer 230 may be formed on the third insulating interlayer pattern 222 so as to cover the MTJ structure. A contact hole (not shown) may be formed through the fourth insulating interlayer 230 to expose the upper electrode 132a. A conductive material may be filled into the contact hole to form an upper electrode contact 232. The upper electrode contact 232 may include a metal (e.g., tungsten, copper, aluminum, titanium, ruthenium, etc.) and/ or a metal nitride (e.g., titanium nitride, etc.).

A bit line 234 may be formed on the fourth insulating interlayer 230 so as to contact the upper electrode contact 232, and may extend in the second direction. The bit line 234 may include a metal (e.g., tungsten, copper, aluminum, titanium, ruthenium, etc.) and/or a metal nitride (e.g., titanium nitride, etc.). A metal wiring pattern (not shown) may be further formed on the bit line 234, and may be electrically connected to a peripheral circuit (not shown).

Figure 26:
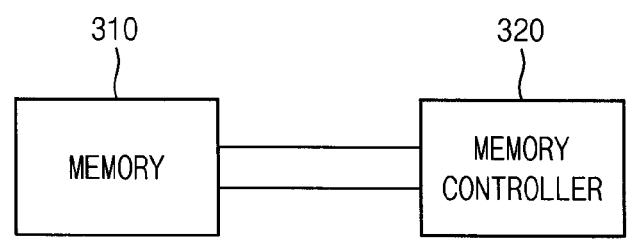

FIG. 26 is a block diagram illustrating a memory system in accordance with example embodiments.

Referring to FIG. 26, the memory system may include a memory controller 320 and a memory 310 connected to the memory controller 320. In example embodiments, the memory 310 may include the MRAM device shown in FIG. 22. The memory controller 320 may provide a control signal for controlling the memory 310.

The MRAM device according to example embodiments may be used in various types of electric devices including, for example, a mobile device, a memory card, a computer, etc.

According to example embodiments, the MTJ structure may be formed with no electrical short therein. The processes for forming the MTJ structure may be used in manufacturing an MRAM device.

What is claimed is:

1. A method of manufacturing an MRAM device, the method comprising:
    sequentially forming a first sacrificial layer, an etch stop layer, and a second sacrificial layer on a substrate;
    partially etching the second sacrificial layer, the etch stop layer and the first sacrificial layer to form a plurality of openings therethrough;
    forming a plurality of lower electrodes filling the openings;
    removing the first and second sacrificial layers and portions of the etch stop layer to form etch stop layer patterns surrounding upper portions of sidewalls of the lower electrodes;
    forming an upper insulating layer pattern between the etch stop layer patterns to partially define a plurality of air pads arranged between adjacent ones of the lower electrodes;
    forming a first magnetic layer, a tunnel barrier layer, a second magnetic layer, and an upper electrode layer on the lower electrodes, the etch stop layer patterns, and the upper insulating layer pattern; and
    etching portions of the upper electrode layer, the second magnetic layer, the tunnel barrier layer, the first magnetic layer, the upper insulating layer pattern, and the etch stop layer patterns to form a plurality of magnetic tunnel junction (MTJ) structures,
    wherein each MTJ structure comprises sequentially stacked layer patterns including a first magnetic layer pattern, a tunnel layer pattern, and a second magnetic layer pattern, and wherein each MTJ structure contacts a respective one of the lower electrodes.

2. The method of claim 1, wherein the first and second sacrificial layer are formed to include silicon oxide, and wherein the etch stop layer is formed to include silicon nitride.

3. The method of claim 1, wherein forming lower electrodes filling the openings includes:
    forming a lower electrode layer on the second sacrificial layer to fill the openings; and
    polishing the lower electrode layer until an upper surface of the second sacrificial layer is exposed.

4. The method of claim 1, wherein removing the first and second sacrificial layers and portions of the etch stop layer to form the etch stop layer patterns includes:
    removing the second sacrificial layer to expose the etch stop layer;
    etching portions of the etch stop layer to form the etch stop layer patterns exposing portions of the first sacrificial layer therebetween; and
    removing the exposed portions of the first sacrificial layer.

5. The method of claim 1, wherein forming the etch stop layer patterns includes:
    forming capping spacers comprising an insulating material on sidewalls of the lower electrodes, said capping spacers protruding from the etch stop layer; and
    etching portions of the etch stop layer between the capping spacers.

6. The method of claim 5, wherein the capping spacers and the etch stop layer are formed including substantially the same material.

7. The method of claim 5, wherein forming the capping spacers includes:
    forming a spacer layer on sidewalls of the lower electrodes and the etch stop layer using a chemical vapor deposition (CVD) process; and
    anisotropically etching the spacer layer.

8. The method of claim 5, wherein removing the second sacrificial layer further includes removing the capping spacers.

9. The method of claim 1, wherein forming the upper insulating layer pattern between the etch stop layer patterns includes:
    forming an upper insulating layer to cover the lower electrodes and a space between the etch stop layer patterns; and
    polishing the upper insulating layer to expose upper surfaces of the lower electrodes.

10. The method of claim 9, wherein the upper insulating layer is formed to include a material having a polishing selectivity with respect to the etch stop layer.

11. The method of claim 1, further comprising forming protection layer patterns on sidewalls of the openings.

12. A method of manufacturing an MRAM device, the method comprising:
    forming a mold structure on a substrate, the mold structure including a first sacrificial layer, an etch stop layer, and a second sacrificial layer sequentially stacked on the substrate, with openings arranged through the first sacrificial layer, the etch stop layer, and the second sacrificial layer;
    forming lower electrodes filling the openings;
    removing the first and second sacrificial layers and forming etch stop layer patterns on upper portions of sidewalls of the lower electrodes;
    forming an upper insulating layer to fill a space between the etch stop layer patterns, wherein the upper insulating layer partially defines an air pad arranged between adjacent ones of the lower electrodes;
    polishing the upper insulating layer and the lower electrodes until the etch stop layer patterns are exposed to form an upper insulating layer pattern between the etch stop layer patterns;
    forming a first magnetic layer, a tunnel barrier layer, a second magnetic layer, and an upper electrode layer on the lower electrodes, the etch stop layer patterns, and the upper insulating layer pattern; and
    etching portions of the upper electrode layer, the second magnetic layer, the tunnel barrier layer, the first magnetic layer, the upper insulating layer pattern, and the etch stop layer patterns to form a plurality of magnetic tunnel junction (MTJ) structures, wherein each MTJ structure includes a sequentially stacked first magnetic layer pattern, tunnel layer pattern, and second magnetic layer pattern, each MTJ structure further contacting a corresponding one of the lower electrodes.

13. The method of claim 12, wherein forming the etch stop layer patterns includes:
   removing the first sacrificial layer to expose the etch stop layer; and
   removing the second sacrificial layer and portions of the etch stop layer to form the etch stop layer patterns, said etch stop layer patterns surrounding upper portions of sidewalls of the lower electrodes.

14. The method of claim 13, wherein removing portions of the etch stop layer includes:
   forming capping spacers on sidewalls of the lower electrodes to protrude from the etch stop layer; and
   etching portions of the etch stop layer between the capping spacers.

15. The method of claim 12, wherein the etch stop layer is formed to include silicon nitride, and wherein the upper insulating layer is formed to include silicon oxide.

16. A method of manufacturing an MRAM device, the method comprising:
   forming a plurality of lower electrodes on a substrate;
   forming etch stop layer patterns surrounding an upper portion of a sidewall of each of the lower electrodes, wherein forming the etch stop layer patterns includes:
      forming capping spacers comprising an insulating material on sidewalls of the lower electrodes, said capping spacers protruding from the etch stop layer; and etching portions of the etch stop layer between the capping spacers;
   forming an upper insulating layer pattern between the etch stop layer patterns to cover an air pad arranged between the lower electrodes; and
   forming a plurality of magnetic tunnel junction (MTJ) structures, each comprising a first magnetic layer pattern, a tunnel layer pattern, and a second magnetic layer pattern, wherein each MTJ structure contacts a respective one of the lower electrodes.

17. The method of claim 16, further comprising:
   sequentially forming a first sacrificial layer, an etch stop layer, and a second sacrificial layer on a substrate;
   partially etching the second sacrificial layer, the etch stop layer, and the first sacrificial layer to form openings therethrough; and
   forming a lower electrode in each of the openings.

18. The method of claim 17, further comprising:
   removing the first and second sacrificial layers and portions of the etch stop layer to form etch stop layer patterns surrounding an upper portion of sidewalls of the lower electrodes, respectively;
   forming an upper insulating layer pattern between the etch stop layer patterns to partially define the air pad between the lower electrodes;
   forming a first magnetic layer, a tunnel barrier layer, a second magnetic layer, and an upper electrode layer on the lower electrodes, the etch stop layer patterns, and the upper insulating layer pattern; and
   etching portions of the upper electrode layer, the second magnetic layer, the tunnel barrier layer, the first magnetic layer, the upper insulating layer pattern, and the etch stop layer patterns to form the plurality of MTJ structures.

19. The method of claim 16, wherein the etch stop layer is formed to include silicon nitride, and wherein the upper insulating layer is formed to include silicon oxide.

* * * * *